(12) United States Patent
Jindal et al.

(10) Patent No.: US 9,330,975 B2
(45) Date of Patent: May 3, 2016

(54) INTEGRATED CIRCUIT SUBSTRATES COMPRISING THROUGH-SUBSTRATE VIAS AND METHODS OF FORMING THROUGH-SUBSTRATE VIAS

(75) Inventors: Anurag Jindal, Boise, ID (US); Hongqi Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 138 days.

(21) Appl. No.: 13/485,539

(22) Filed: May 31, 2012

(65) Prior Publication Data

US 2013/0320538 A1    Dec. 5, 2013

(51) Int. Cl.
*H01L 21/768* (2006.01)
*H01L 23/48* (2006.01)

(52) U.S. Cl.
CPC ........ *H01L 21/76898* (2013.01); *H01L 23/481* (2013.01); *H01L 2225/06541* (2013.01); *H01L 2924/0002* (2013.01)

(58) Field of Classification Search
CPC ............... H01L 21/76898; H01L 2225/06541; H01L 2225/06548; H01L 23/481; H01L 23/49827; H01L 23/5384
USPC ................................................ 438/667, 666
See application file for complete search history.

(56) References Cited

U.S. PATENT DOCUMENTS

| | | | |
|---|---|---|---|
| 6,683,000 B2* | 1/2004 | Fukui et al. ................... | 438/672 |
| 6,743,727 B2* | 6/2004 | Mathad ............... | H01L 21/3065 216/37 |
| 6,806,188 B2* | 10/2004 | Kim .............................. | 438/675 |
| 7,241,679 B2* | 7/2007 | Kameyama ....... | H01L 21/76898 257/E21.597 |
| 7,425,507 B2* | 9/2008 | Lake ................. | H01L 21/30655 257/E21.259 |
| 7,485,967 B2* | 2/2009 | Kameyama ....... | H01L 21/76898 257/774 |
| 7,670,950 B2 | 3/2010 | Richardson et al. | |
| 7,732,925 B2* | 6/2010 | Okayama et al. .............. | 257/774 |
| 7,745,325 B2* | 6/2010 | Koh .................. | H01L 21/76804 257/E21.257 |
| 7,776,741 B2 | 8/2010 | Reid et al. | |
| 7,955,972 B2* | 6/2011 | Chan et al. .................... | 438/648 |
| 8,026,521 B1 | 9/2011 | Or-Bach et al. | |
| 8,030,780 B2* | 10/2011 | Kirby ................ | H01L 21/76898 257/680 |
| 8,119,527 B1* | 2/2012 | Chadrashekar et al. ...... | 438/685 |
| 8,299,517 B2* | 10/2012 | Jang .................. | H01L 27/10814 257/301 |

(Continued)

FOREIGN PATENT DOCUMENTS

WO    WO 2011/149965    12/2011

OTHER PUBLICATIONS

Huang et al.; Negative thermal expansion and electrical properties of Mn3(Cu0.6NbxGe0.4-x)N (x=0.05-0.25) compounds; Science Direct; Material Letters; Dec. 8, 2007; pp. 2381-2384.

(Continued)

*Primary Examiner* — David Zarneke
(74) *Attorney, Agent, or Firm* — Wells St. John, P.S.

(57) ABSTRACT

A method of forming a through-substrate via includes forming a through-substrate via opening at least partially through a substrate from one of opposing sides of the substrate. A first material is deposited to line and narrow the through-substrate via opening. The first material is etched to widen at least an elevationally outermost portion of the narrowed through-substrate via opening on the one side. After the etching, a conductive second material is deposited to fill the widened through-substrate via opening. Additional implementations are disclosed. Integrated circuit substrates are disclosed independent of method of manufacture.

17 Claims, 6 Drawing Sheets

(56) References Cited

U.S. PATENT DOCUMENTS

| | | | |
|---|---|---|---|
| 8,847,400 B2* | 9/2014 | Fujita | H01L 21/76898 257/737 |
| 2006/0148250 A1* | 7/2006 | Kirby | 438/667 |
| 2006/0292866 A1* | 12/2006 | Borwick et al. | 438/667 |
| 2006/0292877 A1* | 12/2006 | Lake | 438/694 |
| 2008/0157287 A1* | 7/2008 | Choi et al. | 257/621 |
| 2009/0111216 A1 | 4/2009 | Weichart et al. | |
| 2009/0278237 A1* | 11/2009 | Cooney et al. | 257/621 |
| 2011/0068477 A1* | 3/2011 | Cooney, III | H01L 21/76898 257/774 |
| 2011/0084400 A1* | 4/2011 | Fujii | H01L 21/76898 257/774 |
| 2012/0001330 A1* | 1/2012 | Huisinga | H01L 21/76898 257/751 |
| 2012/0009776 A1* | 1/2012 | Kirby et al. | 438/613 |
| 2012/0248602 A1* | 10/2012 | Takahashi | H01L 21/76898 257/737 |
| 2014/0027922 A1* | 1/2014 | Uzoh | 257/774 |
| 2014/0264917 A1* | 9/2014 | Huang | H01L 21/76879 257/774 |

OTHER PUBLICATIONS

Huang et al.; Negative thermal expansion and electrical properties of $Mn_3(Cu_{0.6}Nb_xGe_{0.4-x})N$ (x=0.05-0.25) compounds; ScienceDirect, Materials Letters; Dec. 8, 2007; pp. 2381-2384.

Mary et al.; Negative Thermal Expansion from 0.3 to 1050 Kelvin in $ZrW_2O_8$; Science vol. 272; Apr. 5, 1996; pp. 90-92.

Tucker et al.; Negative Thermal Expansion in $ZrW_2O_8$: Mechanisms, Rigid Unit Modes, and Neutron Total Scattering; The American Physical Society, Physical Review Letters; Dec. 12, 2005; pp. 255501-1-255501-4.

* cited by examiner

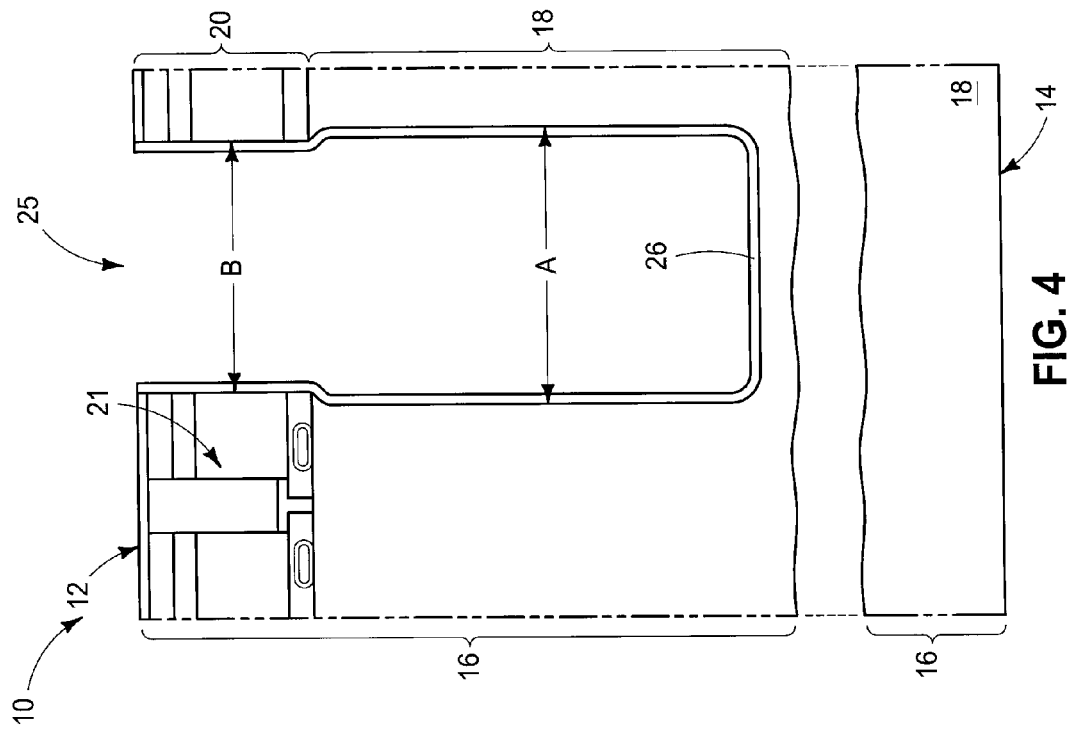
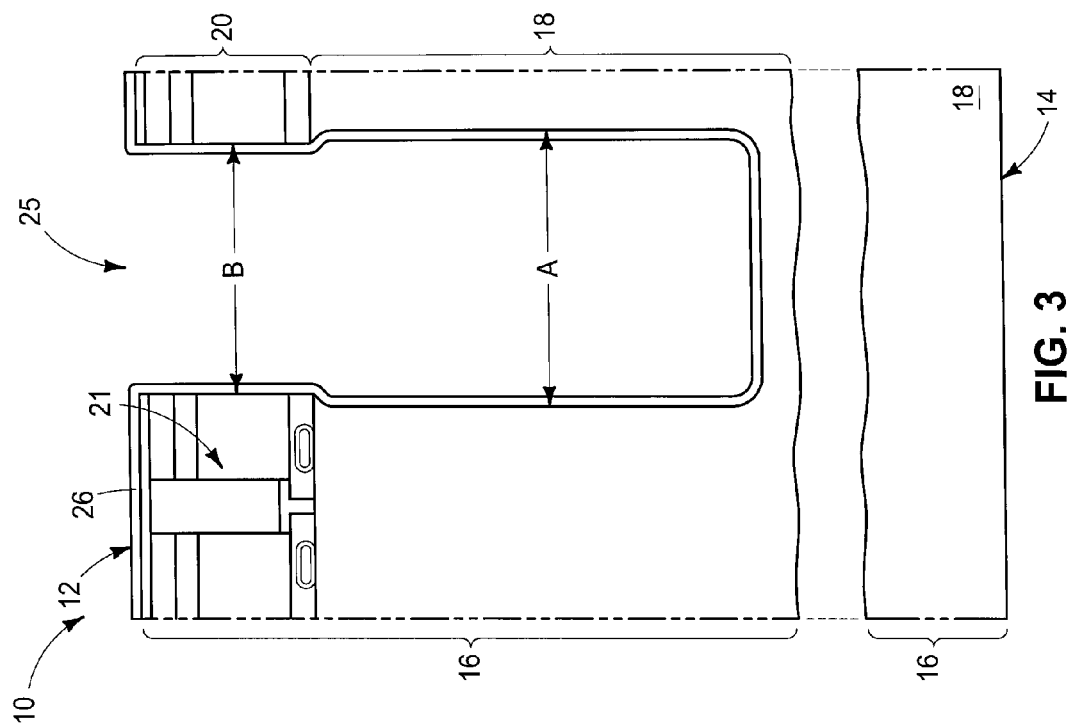

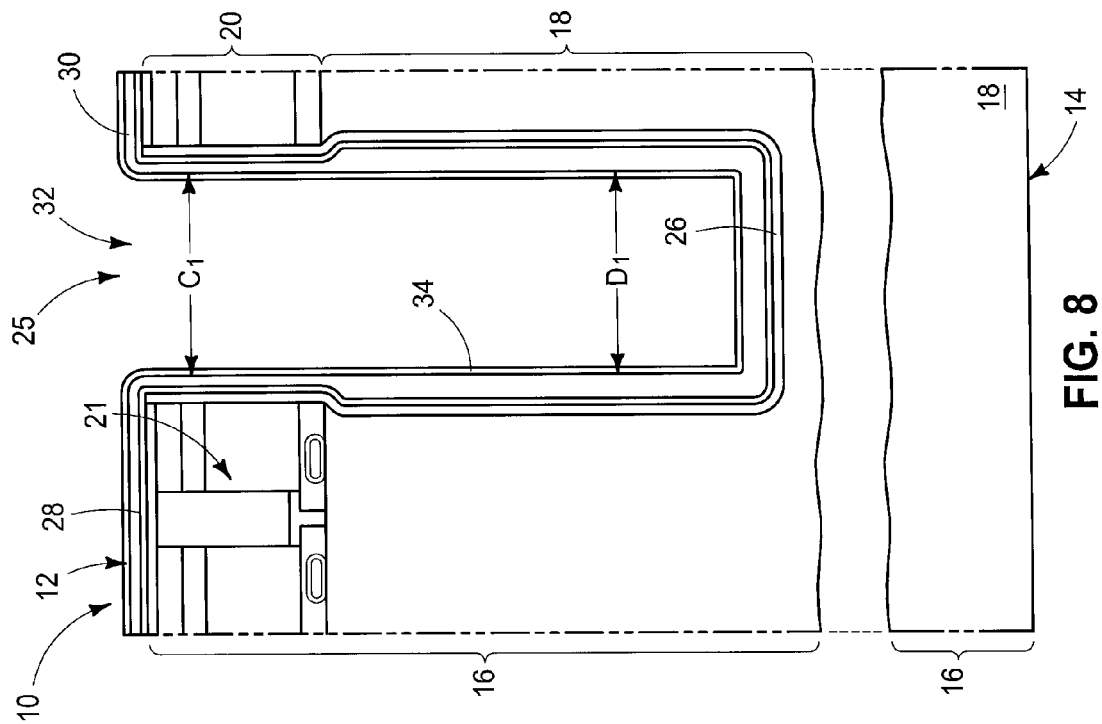
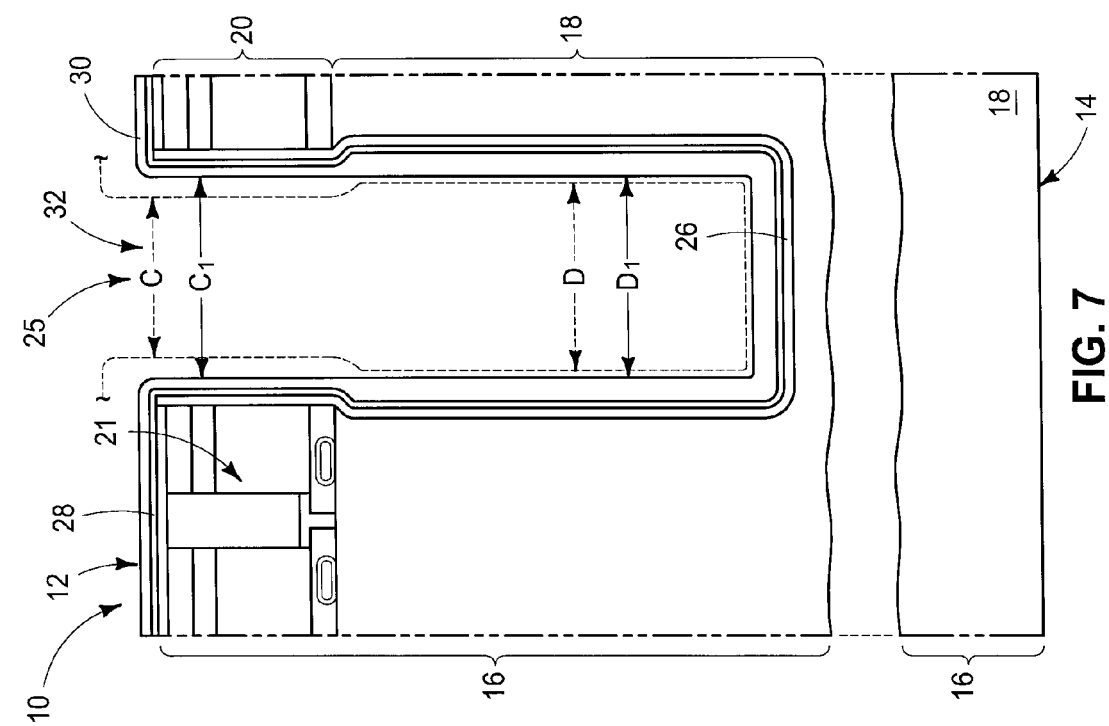

INTEGRATED CIRCUIT SUBSTRATES COMPRISING THROUGH-SUBSTRATE VIAS AND METHODS OF FORMING THROUGH-SUBSTRATE VIAS

TECHNICAL FIELD

Embodiments disclosed herein pertain to integrated circuit substrates comprising through-substrate vias and to methods of forming through-substrate vias.

BACKGROUND

A through-substrate via is a vertical electrical connection passing completely through a substrate comprising integrated circuitry. Through-substrate vias may be used to create 3D packages in 3D integrated circuits and are an improvement over other techniques such as package-on-package because the density of through-substrate vias may be substantially higher. Through-substrate vias provide interconnection of vertically aligned electronic devices through internal wiring that significantly reduces complexity and overall dimensions of a multi-chip electronic circuit.

Common through-substrate via processes include formation of through-substrate via openings through at least some of the thickness of the substrate. A thin dielectric liner is then deposited to electrically insulate sidewalls of the through-substrate via openings. Adhesion and/or diffusion barrier material(s) may be deposited to line over the dielectric. The through-substrate via openings are then filled with conductive material. When the through-substrate via openings are formed only partially through the substrate (e.g., typical when processing bulk substrates), substrate material is removed from the opposite side of the substrate from which the via openings were formed to expose the conductive material within the via openings.

One highly desirable conductive through-substrate via material is elemental copper that is deposited by electrodeposition. Copper may be formed by initially depositing a seed layer within the through-substrate via openings followed by electrodepositing elemental copper from an electroplating solution. An example copper electroplating solution includes copper sulfate as a source of copper ions, sulfuric acid for controlling conductivity, and copper chloride for nucleation of suppressor molecules. It can be difficult to completely deposit a seed layer onto all of the sidewalls of a through-substrate via opening, particularly for high aspect ratio openings. If the sidewalls aren't completely covered, one or more voids can form which may render the substrate inoperable.

Many current through-substrate vias primarily composed of elemental copper-fill undergo thermal expansion at elevated temperature during subsequent thermal processing steps. Because of mismatched thermal expansion coefficients of copper and substrate silicon, the expanded copper via may lead to crack formation into the surrounding silicon substrate which may lead to inoperable circuitry.

BRIEF DESCRIPTION OF THE DRAWINGS

FIG. 3 is a view of the FIG. 2 substrate fragment at a processing stage subsequent to that of FIG. 2.

FIG. 4 is a view of the FIG. 3 substrate fragment at a processing stage subsequent to that of FIG. 3.

FIG. 7 is a view of the FIG. 6 substrate fragment at a processing stage subsequent to that of FIG. 6.

FIG. 8 is a view of the FIG. 7 substrate fragment at a processing stage subsequent to that of FIG. 7.

DETAILED DESCRIPTION OF EXAMPLE EMBODIMENTS

Embodiments of the invention encompass methods of forming a through-substrate via and integrated circuits comprising through-substrate vias independent of method of manufacture. Example embodiments are described with references to FIGS. 1-11.

Figure 1:
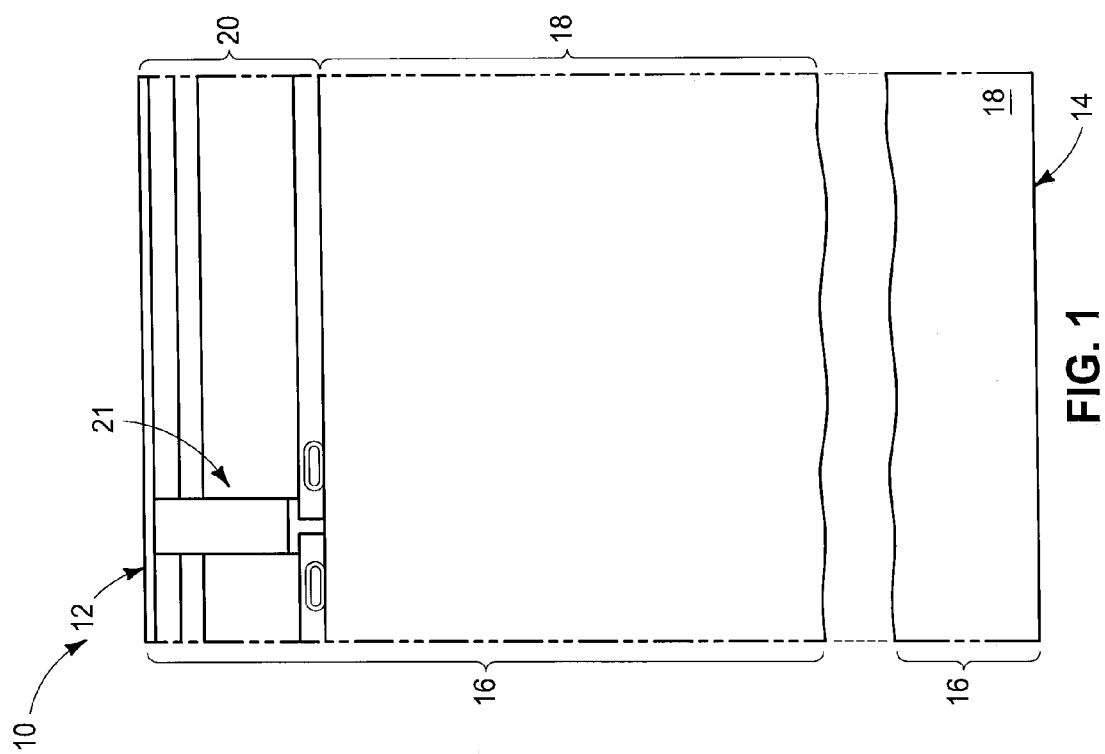
FIG. 1 is a diagrammatic sectional view of a substrate fragment in process in accordance with an embodiment of the invention.

Referring to FIG. 1, a substrate fragment 10 comprises substrate material 16 and has opposing sides 12 and 14. Material 16 may be non-homogenous having multiple materials, regions, layers, and structures constituting integrated circuitry that has been fabricated or is in the process of being fabricated. Example substrate material 16 may comprise materials 18 and 20. Substrate 10 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. For example, material 18 may comprise bulk semiconductor material, for example monocrystalline silicon. Through-substrate vias have also been referred to in the art as through-silicon vias (TSVs). In this document, "through-substrate vias" (TSVs) encompass or are generic to through-silicon vias, and through-substrate vias include conductive vias extending through substrate material regardless of whether any of that material is silicon. Material 20 may comprise a series of dielectric materials, for example the three depicted elevationally outermost layers of dielectric materials. Example integrated circuit components 21 are shown within material 20, and are not particularly germane to the disclosure. For convenience, substrate side 12 is referred to herein in some embodiments as a first side of substrate 10 and substrate side 14 is referred to herein in some embodiments as a second side of substrate 10.

Figure 2:
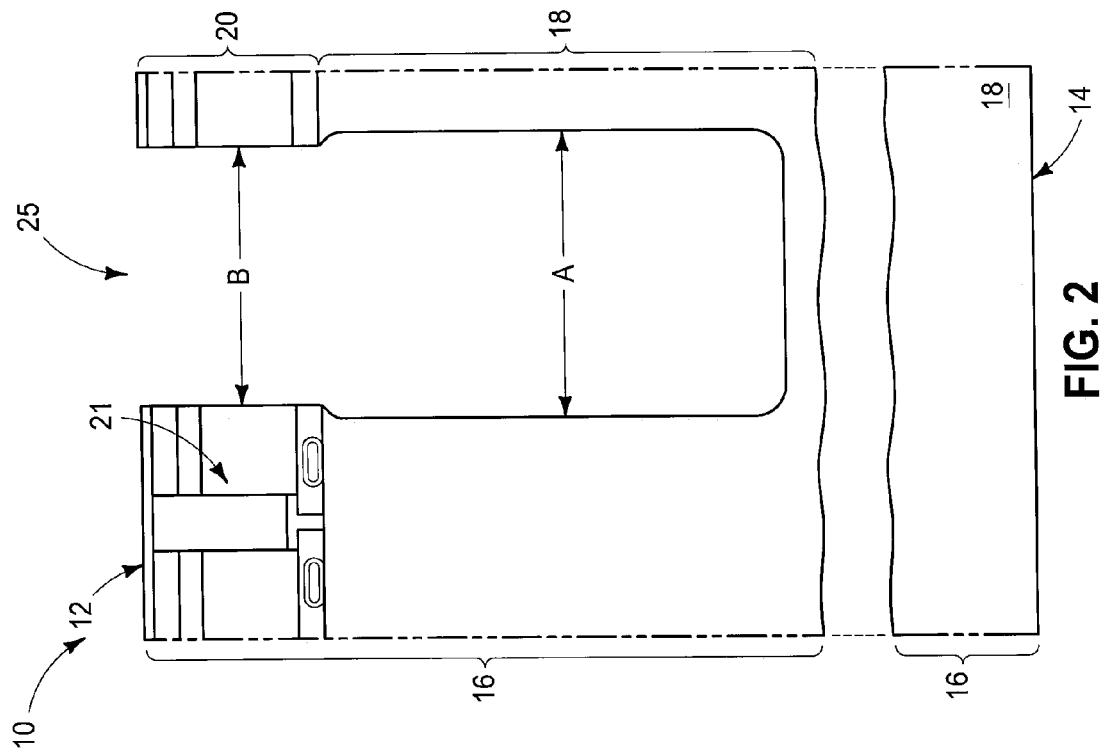
FIG. 2 is a view of the FIG. 1 substrate fragment at a processing stage subsequent to that of FIG. 1.

Referring to FIG. 2, a through-substrate via opening 25 has been formed into substrate 10. Likely multiple openings 25 would be formed, with only one being shown for clarity and brevity in the figures. In one embodiment, via opening 25 extends partially through substrate 10 and is formed from first substrate side 12. Alternately, through-substrate via opening 25 may extend completely through substrate material 16 and/or may be formed from second substrate side 14. Regardless, through-substrate via opening 25 may be formed by chemical and/or physical means, with chemical etching, drilling, and laser ablation being a few examples. If chemical etching, one or more suitable etching chemistries may be used to etch material 20 and one or more suitable etching chemistries used to etch material 18. The three depicted elevationally outermost layers of dielectric materials and layers of material 20 elevationally inward thereof may be etched with different degrees of anisotropy resulting in a stair step-like profile for material 20 (not shown). Alternate profiles may result, for example a smooth taper or no taper with respect to material 20 and/or material 18. Regardless, in one embodiment, through-substrate via opening 25 may have a larger minimum width "A" within material 18 than a minimum width "B" within material 20. Example dimensions A and B are about 4-20 microns and about 3.998-19.998 microns, respectively. In one embodiment, through-substrate via opening 25 is narrower on first substrate side 12 than toward second substrate side 14. Where via opening 25 is formed only partially through substrate 10, an example depth from first substrate side 12 is about 40-120 microns, with an example thickness of substrate 10 between opposing side surfaces 12 and 14 being about 600-1,000 microns. FIG. 2 shows through-substrate via opening 25 formed only partially through substrate 10. Alternately, through-substrate via openings 25 may be formed completely through substrate 10 (not shown), for example as might occur in processing semiconductor-on-insulator substrates.

Referring to FIG. 3 and in one embodiment, sidewalls of through-substrate via opening 25 have been lined with dielectric 26. Such may be homogenous or non-homogenous, with silicon dioxide and/or silicon nitride being examples. FIG. 4 shows one embodiment wherein dielectric 26 has been subjected to etch-back or polish-back to be removed from being received over/as part of first substrate side 12. Alternately as another example, at least some of dielectric 26 may remain over material 20 laterally outward of via opening 25 (not shown).

Figure 5:
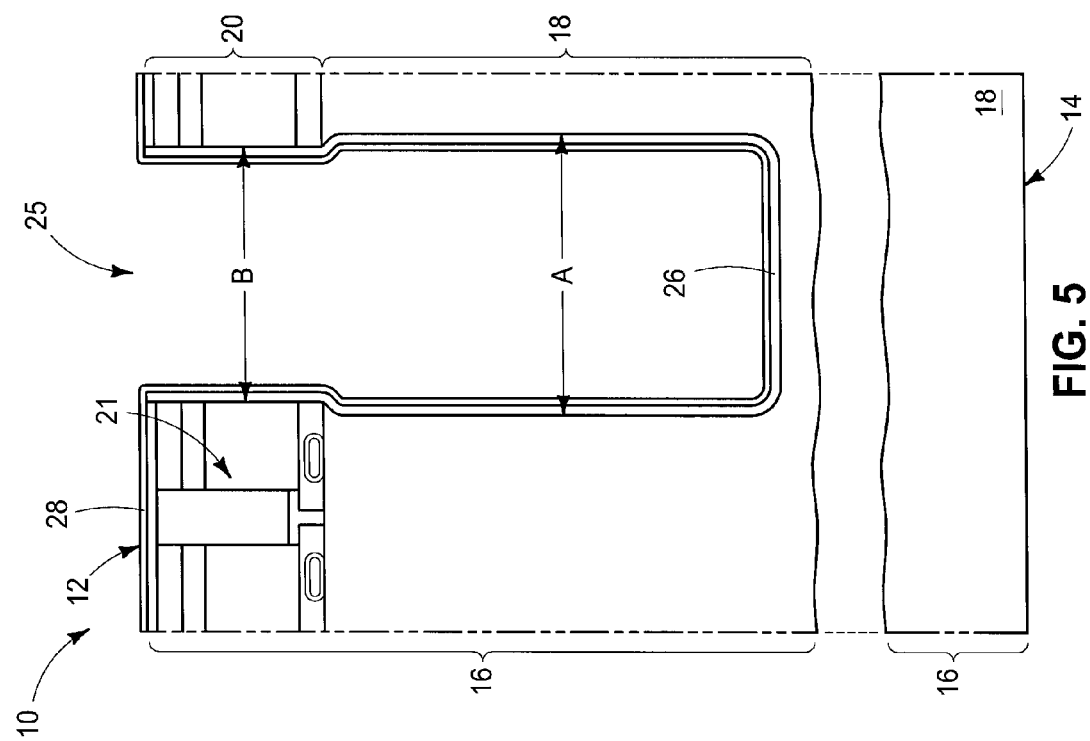
FIG. 5 is a view of the FIG. 4 substrate fragment at a processing stage subsequent to that of FIG. 4.

Referring to FIG. 5 and in one embodiment, a liner 28 has been deposited to within through-substrate via opening 25 over dielectric 26. Liner 28 may be homogenous or non-homogenous, and may be any one or more of conductive, semiconductive, and dielectric. Example materials include one or both of Ti and TiN, for example having respective linear thermal expansion coefficients of $8.5 \times 10^{-6}/°$ C. and $9.4 \times 10^{-6}/°$ C. at 20° C., respectively. Liner 28 may provide a diffusion barrier function and/or may provide an adhesion function with respect to a subsequently deposited material.

Figure 6:
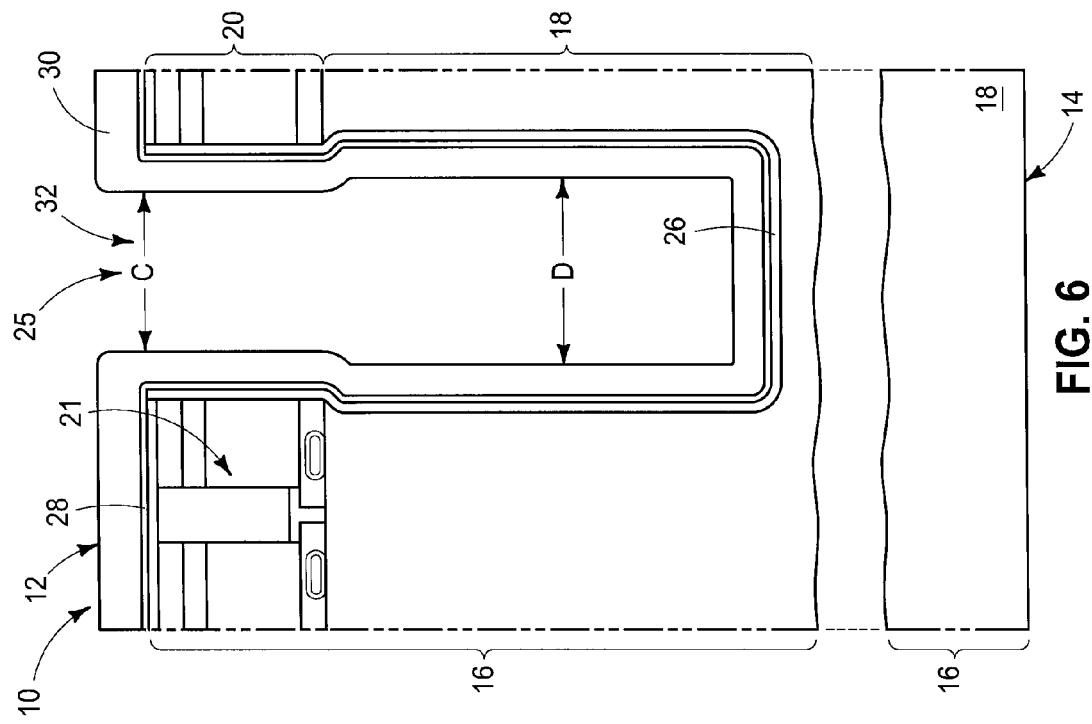
FIG. 6 is a view of the FIG. 5 substrate fragment at a processing stage subsequent to that of FIG. 5.

Referring to FIG. 6, a first material 30 has been deposited to line and narrow through-substrate via opening 25. In one embodiment and as shown, first material 30 has also been deposited over first substrate side 12 laterally of through-substrate via opening 25, and in one embodiment to form an inner opening 32 within through-substrate via opening 25. In one embodiment, inner opening 32 is narrower on first substrate side 12 than toward second substrate side 14, for example as shown with respect to minimum width dimensions C and D. Example dimensions C and D are about 2-19 microns and about 1.998-18.998 microns, respectively. In one embodiment and as shown, first material 30 is also deposited over a base of through-substrate via opening 25. Regardless, first material 30 may be of constant lateral thickness (as shown) or variable lateral thickness (not shown) within through-substrate via opening 25. For example, first material 30 may be laterally thicker deeper within opening 25 whereby inner opening 32 tapers inwardly deeper within opening 25 (not shown). Regardless, an example deposition thickness range for first material 30 is from about 5% to 40% of dimension C.

First material 30 may be homogenous or non-homogenous regardless of whether liner 28 is deposited, and is ideally deposited in a highly conformal manner as shown, for example by one or both of chemical vapor deposition and/or atomic layer deposition. In one embodiment, first material 30 is dielectric. In one embodiment, first material 30 is conductive and has a thermal expansion coefficient that is more than 50% lower than that of a conductive second material deposited to within through-substrate via opening 25 (not shown in FIG. 6), and which is described below. In the context of this document, "thermal expansion coefficient" means the material's linear thermal expansion coefficient as $10^{-6}$°C. at 20 °C. (TEC). In one embodiment, first material 30 has a negative thermal expansion coefficient. Example such first materials include at least one of $ZrW_2O_8$ (e.g., dielectric), $HfW_2O_8$ (e.g., dielectric), $Mn_3(Cu_{0.6}Ge_{0.4})N$ (e.g., conductive), $Mn_3(Cu_{0.7}Ge_{0.3})N$ (e.g., conductive), and $Mn_3(Cu_{0.6}Nb_xGe_{0.4-x})N$, where "x" is from 0.05 to 0.25 (e.g., conductive).

Regardless of thermal expansion coefficient, in one embodiment the first material contains tungsten. Examples of tungsten materials that are conductive include one or more of elemental-form tungsten (e.g., TEC of about 4.6), WN (e.g., TEC of about 4.5-5.8), an alloy of W and WN (e.g., TEC of about 4.5-5.8), an alloy of W and TiN (e.g., TEC of about 4.5-8.0), an alloy of W and Ti (e.g., TEC of about 4.5-8.0), $ZrW_2O_8$ (e.g., TEC of about −9.1) and $HfW_2O_8$ (e.g., TEC of about −9.1). When used, a liner 28 of, for example, Ti/TiN may function as an adhesion layer for tungsten-containing first material 30 for better adherence within via opening 25 than may otherwise occur if contacting directly against dielectric 26. Additional conductive first materials include by way of example only tantalum (e.g., TEC of about 6.6), tantalum/tungsten (e.g., TEC of about 5.6) and tantalum nitride (e.g., TEC of about 3.6).

Referring to FIG. 7, first material 30 has been etched to widen at least an elevationally outermost portion of narrowed through-substrate via opening 32 on first substrate side 12. In one embodiment, the etching also removes some and only some of first material 30 that is lateral of through-substrate via opening 25 on first substrate side 12. The etching may also etch first material that is over the base of through-substrate via opening 25. In one embodiment, such etching removes a greater thickness of first material 30 that is lateral of via opening 25 on first substrate 12 than that which is over the base of through-substrate via opening 25, for example as shown. In one embodiment, the etching of first material 30 also widens that portion of inner opening 32 which is furthest from first substrate side 12 toward second substrate side 14, for example as shown from dimensions C and D to dimensions $C_1$ and $D_1$, respectively. Further in one embodiment and as shown, the widening of inner opening 32 on first substrate side 12 is to a greater degree than the widening of that portion of the inner opening which is furthest from first substrate side 12. Where for example first material 30 contains tungsten, an example etching technique to produce the profile of FIG. 7 from that of FIG. 6 includes using $NF_3$ as an initial etchant to remove tungsten-containing material under mass transport limiting process conditions. This may be achieved by supplying limited amounts of etchant into the processing chamber (e.g., using low etchant flow rates relative to via opening profile and dimensions), while maintaining relative high etching rates to consume some etchant as it diffuses into the via opening. Example parameters include a chamber pressure of approximately 2 Torr, a substrate temperature of approximately 390°C., $NF_3$ flow rate of approximately 410 sccm, and etching duration of approximately 12 seconds. The remaining etched first material 30 may be thicker deeper within the via opening (e.g., about 555 Angstroms lateral thickness on average) than near substrate side 12 (e.g., about 344 Angstroms lateral thickness on average).

A conductive second material is deposited to fill the widened inner opening. The conductive second material may be homogenous or non-homogenous, and in one ideal embodiment comprises an electrodeposited copper-containing material (e.g., TEC of about 17), for example particularly in ideally overcoming one or more of the drawbacks identified in the "Background" section of this document. Any other conductive material(s) may be used for the conductive second material (e.g., conductive materials containing any one or more of titanium, aluminum, platinum, silver, zinc, tin, and nickel), and regardless may be deposited by electrodeposition or other technique(s) whether existing or yet-to-be-developed.

Reference herein to "first" with respect to "first material" and "second" with respect to "conductive second material" in method embodiment aspects are with respect to temporal relationship in the deposition of such materials. Other or additional material(s) may be deposited relative to a through-substrate via opening before, after, or between deposition of the first material and the conductive second material. In some embodiments, the conductive second material may be considered as the "primary conductive material" of the through-substrate via. In this document, a "primary conductive material" is that conductive material which is of the greatest volume of the through-substrate via, and independent of whether such material has the highest intrinsic conductivity of multiple different conductive materials when multiple different conductive materials are used.

Figure 9:
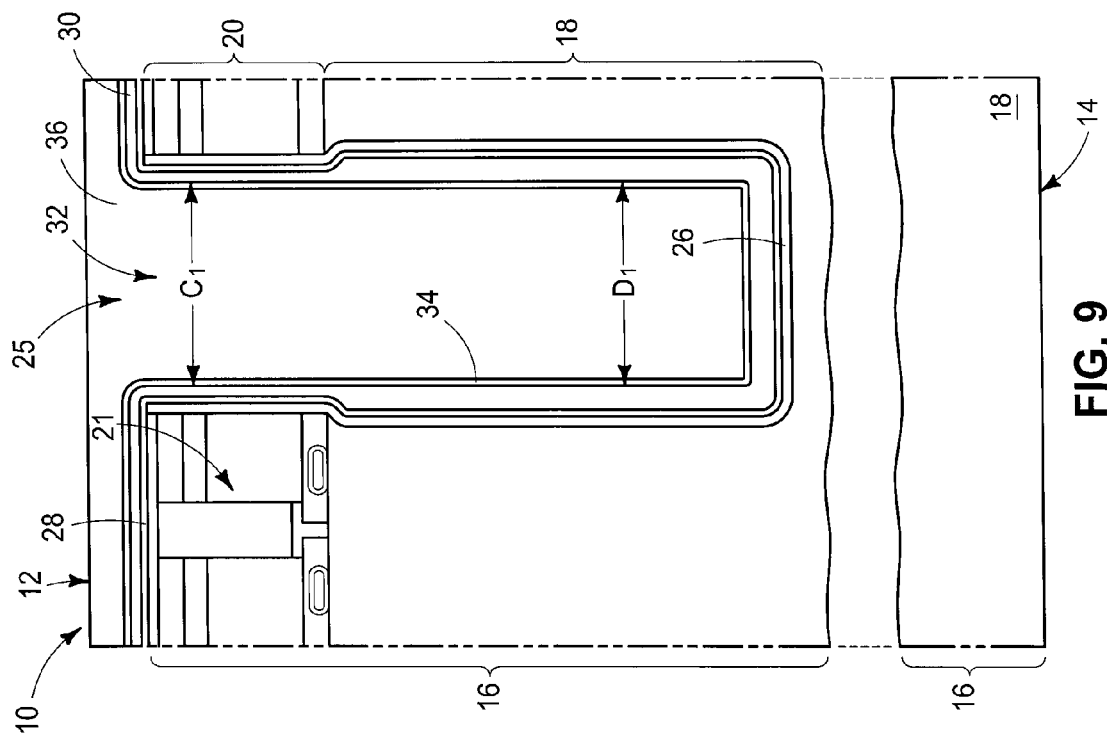
FIG. 9 is a view of the FIG. 8 substrate fragment at a processing stage subsequent to that of FIG. 8.

As an example, FIG. 8 depicts deposition of an electrodepositing seed layer 34, and FIG. 9 depicts subsequent electrodeposition of conductive second material 36. Alternately, seed layer 34 and conductive material 36 may in combination be considered as a conductive second material. A conductive seed layer 34 may be used particularly where first material 30 is dielectric and conductive second material 36 is deposited by electrodeposition. Regardless, where the first material is conductive, the first material and conductive second material are characterized by at least some compositional difference relative one another. Substrate 10 might have previously been masked (not shown) such that conductive second material 36 is selectively electrodeposited as isolated metal within through-substrate via openings 25 (i.e., not being continuous between any separate via openings 25).

Figure 10:
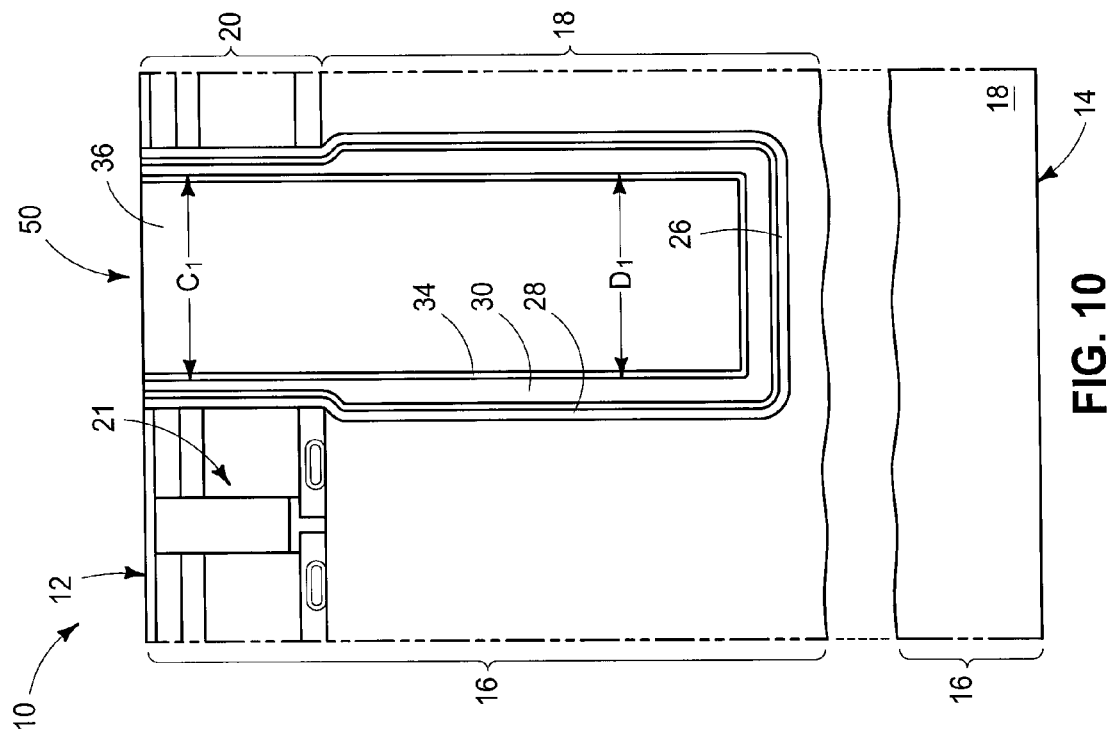
FIG. 10 is a view of the FIG. 9 substrate fragment at a processing stage subsequent to that of FIG. 9.
Figure 11:
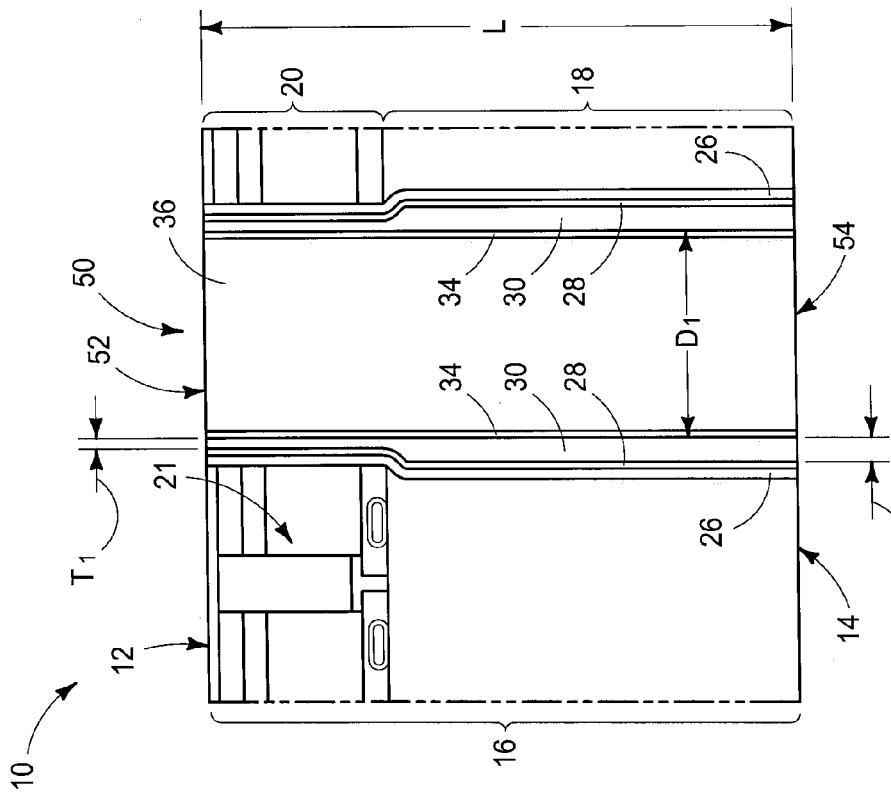
FIG. 11 is a view of the FIG. 10 substrate fragment at a processing stage subsequent to that of FIG. 10, and is taken through line 11-11 in FIG. 12.

Referring to FIG. 10, substrate 10 has been processed to remove conductive materials 28, 30, 34, and 36 from substrate side 12 laterally outside of via opening 25, thereby forming a through-substrate via 50. FIG. 11 depicts completing subsequent back-side removal of substrate material 18 sufficient to expose conductive second material 36. One or more suitable anneals might be conducted, and example techniques for back-side polishing include chemical mechanical polishing using one or more suitable polishing chemistries.

In one embodiment, a method of forming a through-substrate via comprises forming a through-substrate via opening at least partially through a substrate regardless of whether that opening is narrower proximate one of opposing sides of the substrate than furthest from the one opposing side toward the other opposing side. A first material having a negative thermal expansion coefficient is deposited to line the through-substrate via opening. Examples include any of those described above having a negative thermal expansion coefficient in connection with the first-described embodiments. A conductive second material having a positive thermal expansion coefficient is deposited over the first material to fill remaining volume of the through-substrate via opening regardless of whether any etching has been conducted with respect to any of the first material. In one embodiment, the first material is provided to be of variable maximum lateral thickness lengthwise. For example as shown in FIG. 11, first material 30 has at least two (i.e., variable) maximum lateral thicknesses $T_1$ and $T_2$ along a length L. Regardless, any of the other attributes as described above may be employed.

Some embodiments of the invention may alleviate some prior art problems, for example as identified in the "Background" section above. For example, providing a first material lining within a through-substrate via opening having a considerably lower thermal expansion coefficient than that of the primary conductive material (e.g. greater than 50 percent) may alleviate cracking upon thermal expansion of the primary conductive material. Further, cracking may be alleviated or eliminated particularly where the first material has a negative thermal expansion coefficient. Additionally, where for example the first material is deposited by other than physical vapor deposition technique (e.g. by chemical vapor deposition and/or atomic layer deposition), better coverage within through-substrate via openings may occur and thereby facilitate deposition of the primary conductive material in manners which alleviate or eliminate void formation.

Figure 12:
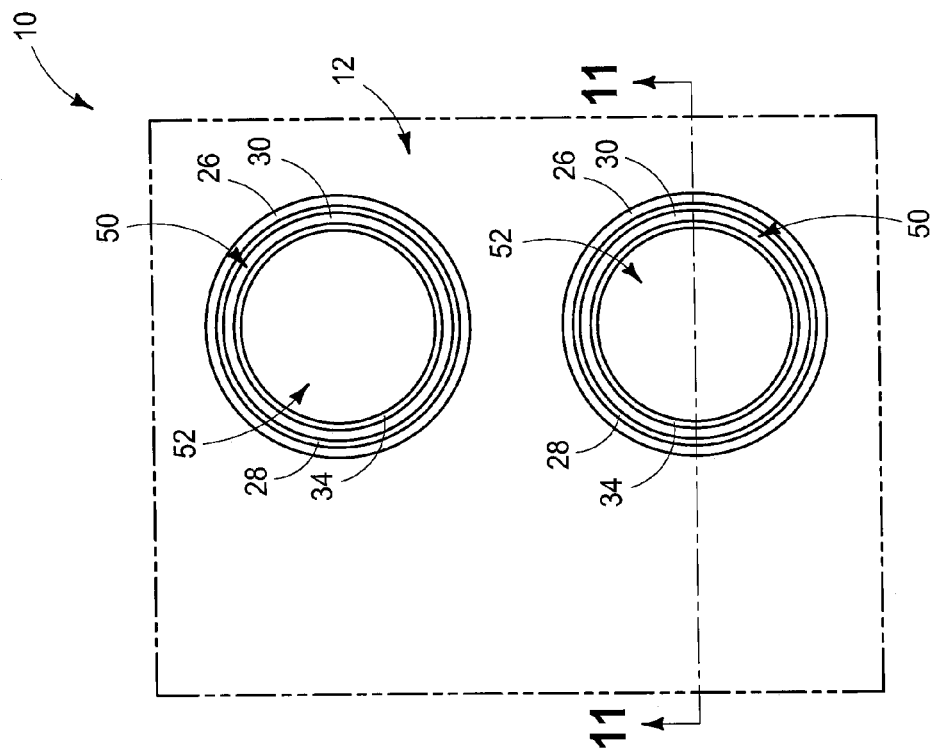
FIG. 12 is a top view of FIG. 11.

Embodiments of the invention include an integrated circuit substrate comprising through-substrate vias that extend between opposing sides of the substrate independent of method of manufacture. In one embodiment, the through-substrate vias individually comprise a lining extending between opposing sides of the substrate (e.g., material 30 in FIG. 11 with respect to through-substrate via 50). The lining is laterally thinner proximate one of the opposing substrate sides than proximate the other of the opposing substrate sides (e.g., as shown in the FIG. 11 embodiment). The lining is received circumferentially about a primary conductive material (e.g., through-substrate via 50 in FIGS. 11 and 12 comprises a lining 30 which is received circumferentially about primary conductive material 36). Where the lining is conductive, it may be electrically coupled with the primary conductive material. The integrated circuit substrate may comprise additional through-substrate vias of construction other than that described. Regardless, any of the material and/or construction attributes described above with respect to the method embodiments may be used.

In one embodiment, a through-substrate via of an integrated circuit substrate comprises a lining extending between opposing sides of the substrate. The lining has a negative thermal expansion coefficient regardless of cross-sectional shape of the lining. The lining is received circumferentially about a conductive second material. The conductive second material has a positive thermal expansion coefficient. Where the lining is conductive, it may be electrically coupled with the primary conductive material. The integrated circuit substrate may comprise additional through-substrate vias of construction other than that described. Regardless, any of the other attributes as described above may be used.

CONCLUSION

In some embodiments, a method of forming a through-substrate via comprises forming a through-substrate via opening at least partially through a substrate from one of opposing sides of the substrate. A first material is deposited to line and narrow the through-substrate via opening. The first material is etched to widen at least an elevationally outermost portion of the narrowed through-substrate via opening on the one side. After the etching, a conductive second material is deposited to fill the widened through-substrate via opening.

In some embodiments, a method of forming a through-substrate via comprises forming a through-substrate via opening at least partially through a substrate from a first side of the substrate. The through-substrate via opening is narrower on the first substrate side than toward a second side of the substrate opposite the first substrate side. A dielectric tungsten-containing material is deposited over the first substrate side laterally of the through-substrate via opening, to line the through-substrate via opening, and to form an inner opening within the through-substrate via opening. The inner opening is narrower on the first side of the substrate than toward the second substrate side. The dielectric tungsten-containing material is etched to widen the inner opening at least on the first substrate side. A copper-containing material is electrodeposited to fill the widened inner opening.

In some embodiments, a method of forming a through-substrate via comprises forming a through-substrate via opening at least partially through a substrate. A first material having a negative thermal expansion coefficient is deposited to line the through-substrate via opening. A conductive second material having a positive thermal expansion coefficient is deposited over the first material to fill remaining volume of the through-substrate via opening.

In some embodiments, an integrated circuit substrate comprises through-substrate vias extending between opposing sides of the substrate. The through-substrate vias individually comprise a lining extending between the opposing sides of the substrate. The lining has a negative thermal expansion coefficient. The lining is circumferentially about a primary conductive material. The primary conductive material has a positive thermal expansion coefficient.

In some embodiments, an integrated circuit substrate comprises through-substrate vias extending between opposing sides of the substrate. The through-substrate vias individually comprise a lining extending between the opposing sides of the substrate. The lining is laterally thinner proximate one of the opposing substrate sides than proximate the other of the opposing substrate sides. The lining is circumferentially about a primary conductive material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a through-substrate via, comprising:
forming a through-substrate via opening to extend only partially elevationally through a substrate from one of two opposing elevationally outermost sides of the substrate, the through-substrate via opening being formed to have a narrower open width on the one elevationally outermost side of the substrate than width of an elevationally innermost portion of the through-substrate via opening most proximate the other of the two opposing elevationally outermost sides of the substrate;
depositing a first material to line and narrow the through-substrate via opening;
etching the first material to widen both a) an elevationally outermost portion of the narrowed through-substrate via opening on the one elevationally outermost side, and b) an elevationally innermost portion of the narrowed through-substrate via opening most proximate the other of the two opposing elevationally outermost sides of the substrate; and
after the etching, depositing a conductive second material to fill the widened through-substrate via opening.

2. The method of claim 1 wherein the first material has a negative thermal expansion coefficient.

3. The method of claim 2 wherein the first material is dielectric.

4. The method of claim 2 wherein the first material is conductive.

5. The method of claim 2 wherein the first material comprises at least one of $ZrW_2O_8$, $HfW_2O_8$, $Mn_3(Cu_{0.6}Ge_{0.4})N$, $Mn_3(Cu_{0.7}Ge_{0.3})N$, and $Mn_3(Cu_{0.6}Nb_xGe_{0.4-x})N$, where "x" is from 0.05 to 0.25.

6. The method of claim 1 wherein the first material contains tungsten.

7. The method of claim 6 wherein the first material is conductive and comprises one or more of elemental-form tungsten, WN, an alloy of W and WN, an alloy of W and TiN, and an alloy of W and Ti.

8. The method of claim 1 wherein the first material contains tantalum.

9. The method of claim 1 wherein the first material is dielectric.

10. The method of claim 1 wherein the first material is conductive and has a thermal expansion coefficient that is more than 50% lower than that of the conductive second material.

11. The method of claim 1 wherein the first material is also deposited over the one elevationally outermost substrate side laterally of the through-substrate via opening, the etching removing only some of the first material that is lateral of the through-substrate via opening on the one elevationally outermost substrate side.

12. A method of forming a through-substrate via, comprising:
forming a through-substrate via opening to extend only partially elevationally through a substrate from a first elevationally outermost side of the substrate, the through-substrate via opening having a narrower open width on the first elevationally outermost substrate side than width of an elevationally innermost portion of the through-substrate via opening most proximate an elevationally outermost second side of the substrate opposite the first elevationally outermost substrate side;
depositing a dielectric tungsten-containing material over the first elevationally outermost substrate side laterally of the through-substrate via opening, to line the through-substrate via opening, and to form an inner opening within the through-substrate via opening, the inner opening having a narrower open width on the first elevationally outermost side of the substrate than most proximate the elevationally outermost second substrate side;
etching the dielectric tungsten-containing material to widen the inner opening at least on the first elevationally outermost substrate side; and
electrodepositing a copper-containing material to fill the widened inner opening.

13. The method of claim 12 wherein the etching widens the inner opening furthest from the first elevationally outermost substrate side toward the second elevationally outermost substrate side.

14. The method of claim 13 wherein the widening of the inner opening on the first elevationally outermost substrate side is to a greater degree than the widening of the inner opening furthest from the first elevationally outermost substrate side.

15. The method of claim 12 wherein the dielectric tungsten-containing material comprises at least one of $ZrW_2O_8$ and $HfW_2O_8$.

16. A method of forming a through-substrate via, comprising:
   forming a through-substrate via opening at least partially elevationally through a substrate from one of two opposing elevationally outermost sides of the substrate, the through-substrate via opening being formed to have a narrower open width on the one elevationally outermost side of the substrate than width of an elevationally innermost portion of the through-substrate via opening most proximate the other of the two opposing elevationally outermost sides of the substrate;
   depositing a first material to line and narrow the through-substrate via opening;
   etching the first material to widen the narrowed through-substrate opening along its entire length; and
   after the etching, depositing a conductive second material to fill the widened through-substrate via opening.

17. The method of claim 16 wherein,
   the narrowed through-substrate opening after depositing of the first material and before the etching has opposing sidewalls that are not everywhere vertical; and
   the etching of the first material forming the through-substrate via opening to have said opposing sidewalls to be everywhere vertical.

* * * * *